(12) United States Patent
Joodaki

(10) Patent No.: US 7,414,477 B2
(45) Date of Patent: Aug. 19, 2008

(54) DISTRIBUTED AMPLIFIER TOPOLOGIES WITH IMPROVED GAIN BANDWIDTH PRODUCT

(75) Inventor: Mojtaba Joodaki, Munich (DE)

(73) Assignee: Atmel Germany GmbH, Heilbronn (DE)

( * ) Notice: Subject to any disclaimer, the term of this patent is extended or adjusted under 35 U.S.C. 154(b) by 94 days.

(21) Appl. No.: 11/346,167

(22) Filed: Feb. 3, 2006

(65) Prior Publication Data
US 2006/0176116 A1     Aug. 10, 2006

(30) Foreign Application Priority Data
Feb. 4, 2005     (DE) ................. 10 2005 006 717

(51) Int. Cl.
*H03F 3/60*     (2006.01)
*H03F 3/68*     (2006.01)
(52) U.S. Cl. .................................... 330/286; 330/295
(58) Field of Classification Search ................ 330/286, 330/295
See application file for complete search history.

(56) References Cited
U.S. PATENT DOCUMENTS

| | | | |
|---|---|---|---|
| 5,136,720 A | 8/1992 | Titus et al. | |
| 5,331,289 A | 7/1994 | Price | |
| 6,304,997 B1 | 10/2001 | Huber | |
| 6,727,762 B1 * | 4/2004 | Kobayashi | ............... 330/295 |

FOREIGN PATENT DOCUMENTS

| | | |
|---|---|---|
| DE | 690 26 796 T2 | 6/1991 |
| DE | 197 01 067 A1 | 7/1998 |
| WO | WO 01/84706 A1 | 11/2001 |

OTHER PUBLICATIONS

Kevin W. Kobayashi et al., "A Novel HBT Distributed Amplifier Design Topology Based on Attenuation Compensation Techniques," IEEE Transactions on Microwave Theory and Techniques, vol. 42, Issue 12, Dec. 1994, pp. 2583-2589.
U. Tietze et al., "Halbleiter-Schaltungstechnik," 9th edition, Springer Verlag 1989, p. 488.

* cited by examiner

*Primary Examiner*—Steven J Mottola
(74) *Attorney, Agent, or Firm*—Muncy, Geissler, Olds & Lowe, PLLC

(57) ABSTRACT

A distributed amplifier is provided that includes an input network that simulates an input signal transmission line, and having an output network that simulates an output signal transmission line, and also having multiple unit cells with amplifying characteristics that are connected in parallel to one another between the input network and the output network, that amplify a signal propagating through the input network and feed it into the output network with a predetermined phase relationship to a signal propagating through the output network. The distributed amplifier is characterized in that each unit cell has a multiplier with an input amplifier and an output amplifier, a control connection of the input amplifier is connected to the input network, a current connection of the input amplifier is connected to a control connection of the output amplifier and is connected through a diode to a current connection of the output amplifier, and current outputs of the input amplifier and of the output amplifier are connected to one another.

7 Claims, 1 Drawing Sheet

DISTRIBUTED AMPLIFIER TOPOLOGIES WITH IMPROVED GAIN BANDWIDTH PRODUCT

This nonprovisional application claims priority under 35 U.S.C. § 119(a) on German Patent Application No. DE102005006717.4, which was filed in Germany on Feb. 4, 2005, and which is herein incorporated by reference.

BACKGROUND OF THE INVENTION

1. Field of the Invention

The present invention relates to a distributed amplifier having an input network that simulates an input signal transmission line, and having an output network that simulates an output signal transmission line, and also having multiple unit cells with amplifying characteristics that are connected in parallel to one another between the input network and the output network, that amplify a signal propagating through the input network and feed it into the output network with a predetermined phase relationship to a signal propagating through the output network.

2. Description of the Background Art

Amplifier structures, which are known as "distributed amplifiers" or "traveling wave amplifiers," are known, for example from the publication, "A Novel HBT Distributed Amplifier Design Topology Based on Attenuation Compensation Techniques," IEEE Transactions on Microwave Theory and Techniques, Vol. 42, No. 12, December 1994. The input networks and output networks are also known as "artificial transmission lines" or "synthetic transmission lines." Their task is to absorb parasitic elements of the unit cells. In this context, absorption is understood to mean that the phase-shifting action of parasitic elements, for example that of input and output capacitances of the unit cells, is altered by phase-shifting components matched thereto in the aforementioned networks such that the input signals amplified by the active cells are fed into the output network with identical phase to a signal propagating in the output network, thus amplifying the signal.

Individual transistors or circuits with multiple transistors are known as unit cells. Thus, for example, the aforementioned publication shows unit cells identified there as "gain cell topologies" with a "conventional bipolar transistor," an "emitter follower/common emitter," or an "emitter follower/cascode with negative feedback." According to this publication, an improvement in the gain-bandwidth product of 200% as compared to conventional common-emitter distributed amplifier configurations is achieved with the structures introduced there.

The goal for distributed amplifiers in general is the largest possible product of large bandwidth and gain. In this regard, this product is limited by the effects of parasitic capacitances, especially by the input capacitances $c_i$ of the unit cells, by a signal attenuation occurring in the input network, and by a signal attenuation occurring in the output network.

Thus, the cutoff frequency $f_{ci}$ resulting from the input capacitances obeys the relationship:

$$f_{ci} = \frac{1}{\pi\sqrt{C_{in}L_{in}}},$$

where $L_{in}$ represents the inductive component of the input network, which is to say of the artificial input transmission line.

The signal attenuation occurring in the input network and that occurring in the output network limit, in particular, the number of unit cells that can usefully be connected in parallel for an increase in the output power and a maximum gain bandwidth product.

A similar relationship applies to the cutoff frequency of the output network. Since the capacitances acting at the input of the unit cells are generally larger than the capacitances acting at the output, the cutoff frequency and thus the bandwidth of the distributed amplifier is generally dominated by effects on the input side.

In an ideal case of loss-less input and output networks, the gain follows the relationship $$G = \frac{n^2 g_m^2 Z_0^2}{4},$$

where $Z_0$ indicates the characteristic impedance of the input network and/or output network, $g_m$ indicates the transconductance of a unit cell, and n indicates the number of unit cells. In the ideal case, the gain G can be increased by increasing the number of unit cells. In reality, however, the number of unit cells that can usefully be employed is limited by the aforementioned losses in the input and output networks.

SUMMARY OF THE INVENTION

It is therefore an object of the present invention to provide a distributed amplifier with an increased product of gain and bandwidth and with the simplest possible structure of the unit cells involved.

This object is attained in a distributed amplifier in that each unit cell has a multiplier with an input amplifier and an output amplifier, a control connection of the input amplifier is connected to the input network, a current connection of the input amplifier is connected to a control connection of the output amplifier and is connected through a diode to a current connection of the output amplifier, and current outputs of the input amplifier and of the output amplifier are connected to one another.

Measurements have shown that a multiplier configuration of this nature reduces the input capacitances and output capacitances by up to 30% with respect to a driver current density, and doubles the transconductance of a unit cell as compared to a single transistor. Consequently, in accordance with the above equations, a higher gain and a larger bandwidth result, leading overall to a significant increase in the gain bandwidth product of each unit cell, and thus of the distributed amplifier as a whole, with a simple circuit structure. In addition to these effects, this multiplier configuration results overall in an improved approximation to the ideal of a rectangular curve of the gain over driver current.

The input amplifier and the output amplifier can each be a single transistor.

The implementation with individual amplifiers represents an especially simple embodiment in terms of circuit design.

In a further embodiment, the second current connections of the input amplifier and the output amplifier can be connected to the output network through an additional amplifier located in series with the output amplifier.

This embodiment further increases the dielectric strength of the arrangement.

Another embodiment provides that the additional amplifier can be implemented as, for example, a common-base or common-gate circuit of a transistor.

Such a common-base or common-gate circuit of a transistor at the output of the gain bandwidth product multiplier reduces the increase in the input capacitance of the unit cell to be expected as a result of the Miller effect. In addition, since only a single transistor is used as the output with the third transistor, the output capacitance is also reduced. Moreover, this structure has improved electrical isolation between the input and output. On account of the common-base circuit of the third transistor, a lower output conductance of the circuit as a whole results overall.

Also, the single transistors can be implemented as bipolar transistors.

In general, the gain bandwidth product is limited both by the transit time of the charge carriers through components and by parasitic capacitances of the components. The advantages of the invention are generally exhibited in all cases when the limitation of the gain bandwidth product is dominated more by parasitic capacitances than by transit time effects. Since this is usually the case with bipolar transistors, the invention produces an especially pronounced increase in the gain bandwidth product in conjunction with these components. It is a matter of course, however, that the invention is not limited to an implementation with bipolar transistors, but also permits implementations with other types of transistors, which by way of example can include MOSFETs, JFETs (junction FETs), HFETs (heterostructure FETs), etc., although this list is by no means complete.

The single transistors can be implemented as bipolar SiGe heterojunction transistors.

Such an SiGe heterojunction transistor is characterized by a thin, p-doped SiGe layer as a base layer. As a result, the active base layer can be kept very thin, which reduces the transit time of charge carriers, thus increasing the gain bandwidth product. SiGe heterojunction transistors are thus especially suitable for increasing the gain bandwidth product in conjunction with the invention. It is a matter of course, however, that the invention also exhibits its advantages in conjunction with other types of transistors.

An alternative embodiment provides, therefore, that the single transistors can be implemented as field effect transistors.

The embodiment with field effect transistors also provides a high gain in conjunction with a low output conductance and good isolation between the input network and output network.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
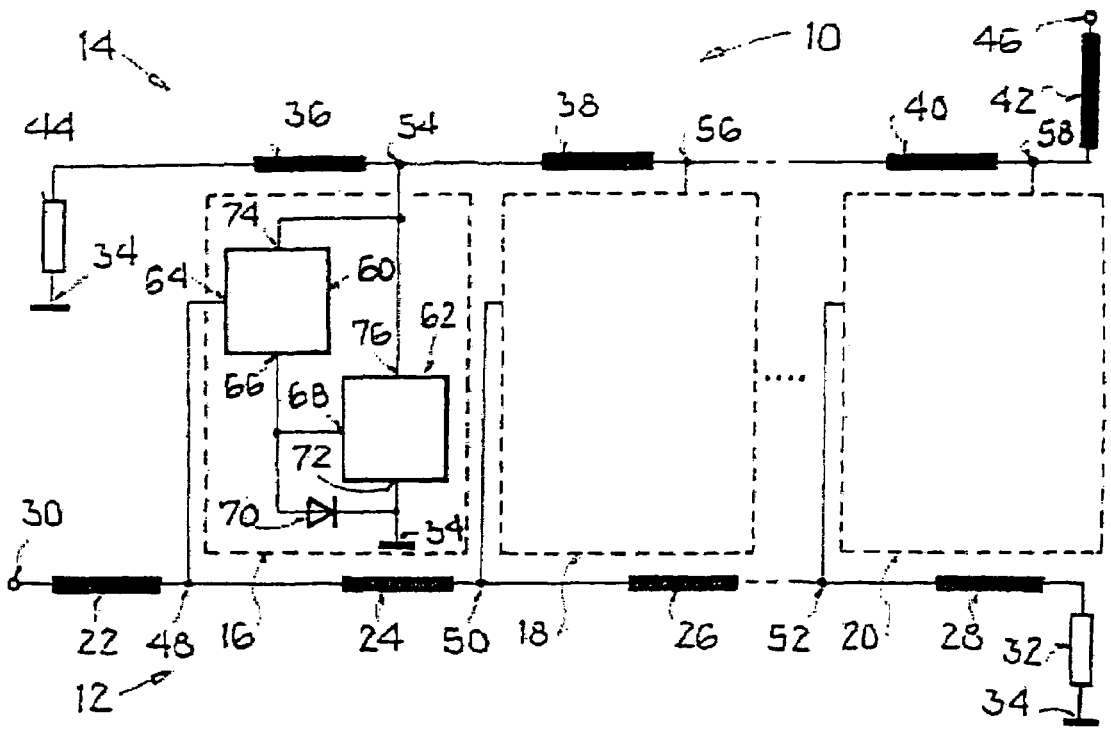
FIG. 1 illustrates a distributed amplifier according to an embodiment of the present invention.

Specifically, FIG. 1 shows a distributed amplifier 10 with an input network 12, an output network 14, and n=3 unit cells 16, 18, 20, which are connected in parallel to one another between the input network 12 and the output network 14. The input network 12 has a series connection of inductive elements 22, 24, 26, 28, which connects an input 30 of the distributed amplifier 10 to a reference voltage 34 through an ohmic resistor 32. The output network 14 also has a series connection of inductive elements 36, 38, 40, 42, which connect a reference voltage connection 34 to an output 46 of the distributed amplifier 10 through an ohmic resistor 44.

Each unit cell 16, 18, 20 is connected to the input network 12 through one unit cell input 48, 50, 52 and is connected to the output network 14 through one unit cell output 54, 56, 58. Each pair of adjacent unit cell inputs 48, 50, 52 is connected together by one of the inductive elements 24, 26. In corresponding fashion, each pair of adjacent unit cell outputs 54, 56, 58 is connected together by one of the inductive elements 38, 40.

A high frequency signal that is supplied to the distributed amplifier 10 through the input 30 is amplified by the unit cells 16, 18, 20 and is fed into the output network 14. In this context, the high frequency signal propagates through the arrangement in a wavelike manner, so that individual phase shifts occur between individual nodes of the distributed amplifier 10. The term node here includes the input 30, the output 46, the unit cell inputs 48, 50, 52, and the unit cell outputs 54, 56, 58. In particular, parasitic capacitances of the unit cells 16, 18, 20 result in a phase shift between each unit cell input 48, 50, 52, and each associated unit cell output 54, 56, 58 of the unit cells 16, 18, 20.

The inductive elements 22, 24, 26, 28 of the input network 12 and the inductive elements 36, 38, 40, 42 of the output network 14 likewise have a phase-shifting effect; in the circuit design of the distributed amplifier 10, this effect is dimensioned such that it absorbs parasitic elements of the unit cells 16, 18, 20. In other words, the phase-shifting effect of parasitic elements, for example of input capacitances and output capacitances of the unit cells 16, 18, 20 is altered by inductances 22, 24, 26, 28, 36, 38, 40, 42 that are matched thereto in the aforementioned networks 12, 14, such that the input signal amplified by the active cells 16, 18, 20 is in each case fed into the output network with a phase equal to a signal propagating through the output network, thereby amplifying the signal on its path from input 30 to output 46.

It is understood that the arrangement shown of inductive elements 22, 24, 26, 28 and 36, 38, 40, 42 is strictly in the nature of an example. The important point is always that the input network 12 simulates an input signal transmission line and that the output network 14 simulates an output signal transmission line, each under the boundary condition of absorption of the parasitic AC resistances of the unit cells. Thus, in the general case, both the input network 12 and the output network 14 can have any type of AC resistances in any desired arrangement that meets this boundary condition.

It is further understood that only the components essential for AC amplification are shown in the figures. For reasons of clarity, neither supply voltages nor circuit parts and components for setting an operating point of the amplifiers and transistors are shown. The multiple unit cells 16, 18, 20 having amplifying characteristics are connected in parallel to one another between the input network 12 and the output network 14; under the conditions stated, said unit cells amplify a signal propagating through the input network 12 and supply it into the output network with a phase relationship relative to a signal propagating in the output network that is correct for amplification. FIG. 1 shows three such unit cells 16, 18, 20. It is understood, however, that the number n of unit cells can also differ from three, so that FIG. 1 is to be understood as a representation of a distributed amplifier 10 with a first unit cell 16, a second unit cell 18, and n–2 additional unit cells, of which an nth unit cell is labeled 20.

In this context, the distributed amplifier 10 is distinguished by unit cells 16, 18, 20, each of which has a multiplier with an input amplifier 60 and an output amplifier 62. A control connection 64 of the input amplifier 60 is connected to the input network 12, while a current connection 66 of the input amplifier 60 is connected to a control connection 68 of the output amplifier 62 and is connected through a diode 70 to a current connection 72 of the output amplifier 62, and to the reference voltage 34. Current outputs 74, 76 of the input amplifier 60 and of the output amplifier 62 are connected to one another and to the output network 14. The internal structure of the other unit cells 18, 20 is identical to the internal structure of the first unit cell.

Figure 2:
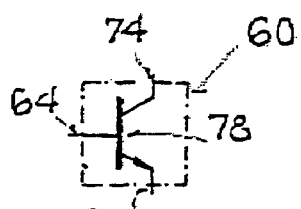
FIG. 2 illustrates a first embodiment of an input amplifier and/or output amplifier from FIG. 1.
Figure 3:
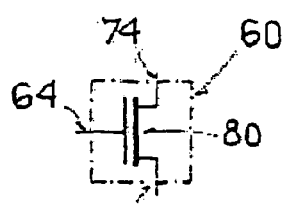
FIG. 3 illustrates a second embodiment of an input amplifier and/or output amplifier from FIG. 1.

FIGS. 2 and 3 show alternative embodiments of the input amplifier 60 as single transistors 78 or 80. In this context, the single transistor 78 is a bipolar transistor, for example a bipolar SiGe heterojunction transistor. The single transistor 80 is a field effect transistor. The output amplifier 62 has the same structure in each case. It is understood that the input amplifier 60 and/or the output amplifier 62 can also have a network of transistors and/or operational amplifiers. Transistors of the N conductivity type are shown in each case. This is compatible with a ground potential as the reference voltage 34. It is understood, however, that transistors of the P conductivity type can also be used in the case of an inversion of supply voltages and ground potentials.

Figure 4:
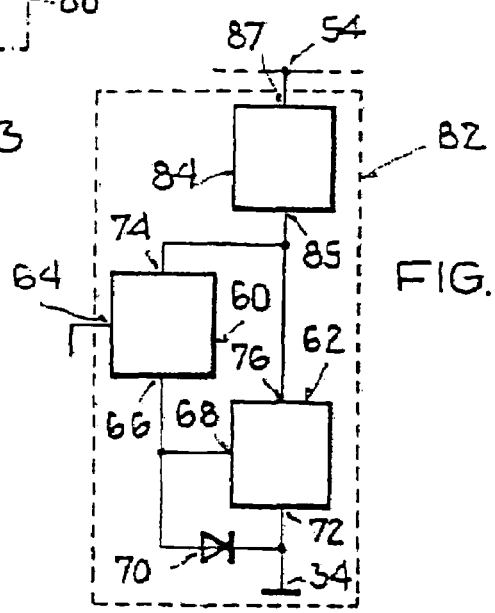
FIG. 4 illustrates an embodiment of a unit cell from FIG. 1.

FIG. 4 shows an embodiment of a unit cell 82 which differs from the unit cell 16 of FIG. 1 by an additional amplifier 84. The additional amplifier 84 is connected in series between the output network 14 and the output amplifier 62, so that the current outputs 74, 76 of the input amplifier 60 and of the output amplifier 62 are connected to a current connection 85 of the additional amplifier 84, and a current output 87 of the additional amplifier 84 is connected through the unit cell output 54 to the output network 14.

Figure 5:
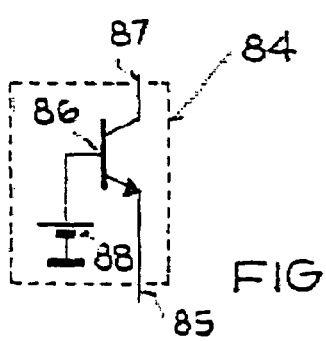
FIG. 5 illustrates an embodiment of another amplifier of the unit cell from FIG. 4.

An embodiment of the additional amplifier 84 of the unit cell 82 from FIG. 4 is shown in FIG. 5. The additional amplifier 84 here is implemented as a single transistor 86 whose control input is supplied by a DC control voltage source 88. FIG. 5 thus shows a bipolar transistor in a common-base circuit as the additional amplifier 84. It is understood, however, that the additional amplifier 84 can also be constructed with a field-effect transistor in a common-gate circuit or with a network of transistors and/or operational amplifiers.

Thus, the additional amplifier 84 can have, for example, a gain bandwidth product multiplier that has the same circuit topology as the remainder of the circuit consisting of input amplifier 60, output amplifier 62, and a diode 70, where a control connection of the input amplifier of this gain bandwidth product multiplier is then intended for connection to a constant reference voltage. Such an embodiment of the additional amplifier 84 as a gain bandwidth product multiplier achieves a further increase in the cutoff frequency.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A distributed amplifier comprising:
   an input network that substantially simulates an input signal transmission line;
   an output network that substantially simulates an output signal transmission line;
   a plurality of unit cells, each having amplifying characteristics, that are connected in parallel to one another between the input network and the output network to amplify a signal propagating through the input network and to provide the signal to the output network with a predetermined phase relationship to a signal propagating through the output network,
   wherein each unit cell has a multiplier with an input amplifier and an output amplifier, a control connection of the input amplifier being connected to the input network, a current connection of the input amplifier being connected to a control connection of the output amplifier and being connected through a diode to a current connection of the output amplifier, and current outputs of the input amplifier and of the output amplifier are connected to one another.

2. The distributed amplifier according to claim 1, wherein the input amplifier and the output amplifier are each a single transistor.

3. The distributed amplifier according to claim 1, wherein the current outputs of the input amplifier and of the output amplifier are connected to the output network through an additional amplifier located in series with the output amplifier.

4. The distributed amplifier according to claim 3, wherein the additional amplifier is a common-base or common-gate circuit of a transistor.

5. The distributed amplifier according to claim 2, wherein the single transistor is a bipolar transistor.

6. The distributed amplifier according to claim 2, wherein the single transistor is implemented as bipolar SiGe heterojunction transistors.

7. The distributed amplifier according to claim 2, wherein the single transistor is a field effect transistor.

* * * * *